United States Patent
Yamamoto et al.

(10) Patent No.: US 7,412,120 B2
(45) Date of Patent: Aug. 12, 2008

(54) OPTICAL MODULE AND OPTICAL TRANSMISSION APPARATUS

(75) Inventors: Hiroshi Yamamoto, Inagi (JP); Masanobu Okayasu, Yokohama (JP); Kazumi Kawamoto, Yokohama (JP)

(73) Assignee: Opnext Japan, Inc., Yokohama-Shi (JP)

( * ) Notice: Subject to any disclaimer, the term of this patent is extended or adjusted under 35 U.S.C. 154(b) by 0 days.

(21) Appl. No.: 11/030,106

(22) Filed: Jan. 7, 2005

(65) Prior Publication Data

US 2005/0259911 A1    Nov. 24, 2005

(30) Foreign Application Priority Data

May 19, 2004    (JP) ............... 2004-148959

(51) Int. Cl.
*G02B 6/12* (2006.01)
*G02B 6/26* (2006.01)
*G02B 6/36* (2006.01)

(52) U.S. Cl. .................. 385/14; 385/15; 385/92
(58) Field of Classification Search ............ 385/14, 385/15, 92
See application file for complete search history.

(56) References Cited

U.S. PATENT DOCUMENTS

| | | | |
|---|---|---|---|
| 4,639,713 A * | 1/1987 | Kitagawa et al. ............ 340/427 |
| 4,730,333 A * | 3/1988 | Butenuth .................... 372/87 |
| 4,912,715 A | 3/1990 | Aoki | |
| 4,989,930 A | 2/1991 | Nakagawa et al. | |
| 6,841,733 B2 * | 1/2005 | Schiaffino et al. ........... 174/52.5 |
| 6,931,190 B2 * | 8/2005 | Ino et al. .................... 385/128 |
| 2003/0001081 A1 | 1/2003 | Kaneko | |
| 2003/0012529 A1 * | 1/2003 | Kobayashi et al. ........... 385/103 |
| 2003/0156811 A1 * | 8/2003 | Ino et al. .................... 385/128 |
| 2004/0074661 A1 * | 4/2004 | Schiaffino et al. ........... 174/52.5 |
| 2005/0009004 A1 * | 1/2005 | Xu et al. .................... 435/4 |
| 2005/0067698 A1 * | 3/2005 | Aruga et al. ................ 257/737 |
| 2005/0193800 A1 * | 9/2005 | DeBoer et al. .............. 73/1.06 |

FOREIGN PATENT DOCUMENTS

| | | |
|---|---|---|
| DE | 43 43 494 | 6/1995 |
| EP | 0 987 802 | 3/2000 |
| EP | 1 376 751 | 2/2004 |
| JP | 4-279079 | 10/1992 |

(Continued)

OTHER PUBLICATIONS

Hassaine et al "Parasitic Element Influence On Laser Driver Performances For 1.3 micron Fiber Optical Communication" Journal de Physique III France 3, Sep. 1, 1993, pp. 1751-1759.

(Continued)

*Primary Examiner*—Kianni C Kaveh
(74) *Attorney, Agent, or Firm*—Antonelli, Terry, Stout & Kraus, LLP.

(57) ABSTRACT

The present invention provides a structure that makes high-frequency transmission possible in an optical module and in the optical transmission apparatus using the module. The invention has means that excludes, from the service band of the optical module, frequency of the standing waves occurring at connection between the first high-frequency signal line substrate and second high-frequency signal line substrate in the optical module.

5 Claims, 6 Drawing Sheets

FOREIGN PATENT DOCUMENTS

| | | |
|---|---|---|
| JP | 06-169107 | 6/1994 |
| JP | 06-244504 | 9/1994 |
| JP | 11-74395 | 3/1999 |
| JP | 11-87852 | 3/1999 |
| JP | 11-196055 | 7/1999 |
| JP | 2000-091695 | 3/2000 |
| JP | 2003-060280 | 2/2003 |
| JP | 2004-40257 | 2/2004 |
| JP | 2004-79989 | 3/2004 |

OTHER PUBLICATIONS

Japanese Office Action dated May 29, 2007.

* cited by examiner

FIG. 11

OPTICAL MODULE AND OPTICAL TRANSMISSION APPARATUS

CLAIM OF PRIORITY

The present application claims priority from Japanese application serial no. 2004-148959, filed on May 19, 2004, the content of which is hereby incorporated by reference into this application.

BACKGROUND OF THE INVENTION

The present invention relates to an optical module that accommodates therein a photosemiconductor device for use in optical communication, and to an optical transmission apparatus using the optical module.

Optical transmission apparatus uses a semiconductor laser and/or photodiodes to transmit/receive light.

Laser modules containing a semiconductor laser device are briefly described below.

In optical transmission apparatus, the light emitted from a semiconductor laser device needs to be efficiently introduced into and coupled to a fiber. The semiconductor laser device is mounted in a hermetically sealed condition in a package made primarily of a metal. For example, the container described in Japanese Patent Laid-Open No. Hei 11-74395 has a frame body formed of any of a metal, an insulator, or a compound material thereof, a first bottom plate fixed to the frame body, and a second metallic bottom plate fixed to the first bottom plate.

In a known configuration for implementing signal transmission at a rate exceeding 10 Gbits/s, as in the related example disclosed in, for example, Japanese Patent Laid-Open No. 2004-40257, the signal to be modulated is transmitted to the interior of a package by using a high-frequency connector provided at the input section of the package in order to receive this signal from the exterior of the package, and the connector is connected to a semiconductor laser device via the transmission line and bonding wire of the substrate formed inside the package.

For internal connection of the package, a cooling element (e.g., a Peltier element) is used to ensure constant characteristics of the semiconductor laser device. More specifically, the configuration using the packaging substrate side of the semiconductor laser device as a cooling plane, and the frame side of the package as a heat-dissipation plane, is used to cool the semiconductor laser device. For this reason, the route from the high-frequency connector (heat sink) on the wall surface of the package to the packaging substrate side (cooler) of the semiconductor laser device needs to be thermally separated. As shown in, for example, Japanese Patent Laid-Open No. 2004-79989 or Japanese Patent Laid-Open No. Hei 11-87852, a configuration is known that uses wire bonding (or the like) to connect the packaging substrate of a cooling element and the substrate mounted on the inner wall of the package.

Laser modules have been described above. It is also known, however, that even in the photodiode module containing a photodiode, the packaging substrate to be connected to a high-frequency connector, and the packaging substrate with a photodiode device mounted thereon are connected using wire bonding. Additionally, it is known that the packaging substrate to be connected to a high-frequency connector, and the packaging substrate with a photodiode device mounted thereon are fixed to a package housing by using independent conductors.

In recent years, there are increasingly growing needs for even-higher-frequency applications exceeding 40 GHz. Accordingly, the improvement of high-frequency connectors for optical module input and output signals of wider frequency bands is being accelerated. At the same time, however, the problem is occurring that depending on the mounting status of the optical module in the package, 40 Gbits/s signal transmission is impeded.

Hermetic sealing packages for accommodating semiconductor laser devices typically use a metal conductor excellent in heat-sinking performance and/or in hermetic sealing weldability, such as iron-nickel-cobalt (Fe—Ni—Co), iron-nickel (Fe—Ni), or copper-tungsten (CuW). Also, these packages usually measure about 5 to 10 mm in height in order to allow for mounting in an optical transmission apparatus. The housing of such a size has come to be seen that wire-bonded sections and other discontinuous sections of a low electric-field containment level suffer resonance in a cavity due to the electric field.

SUMMARY OF THE INVENTION

The present invention has means that excludes, from a service band of an optical module, frequency of the standing waves occurring at a connection between a first high-frequency signal line substrate and second high-frequency signal line substrate in the optical module.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

Embodiments of the present invention are described below referring to the accompanying drawings. In each drawing, illustration of part of components, bonding/fixing materials, and the like are omitted, as appropriate, to avoid complexity.

FIRST EXAMPLE

Figure 1:
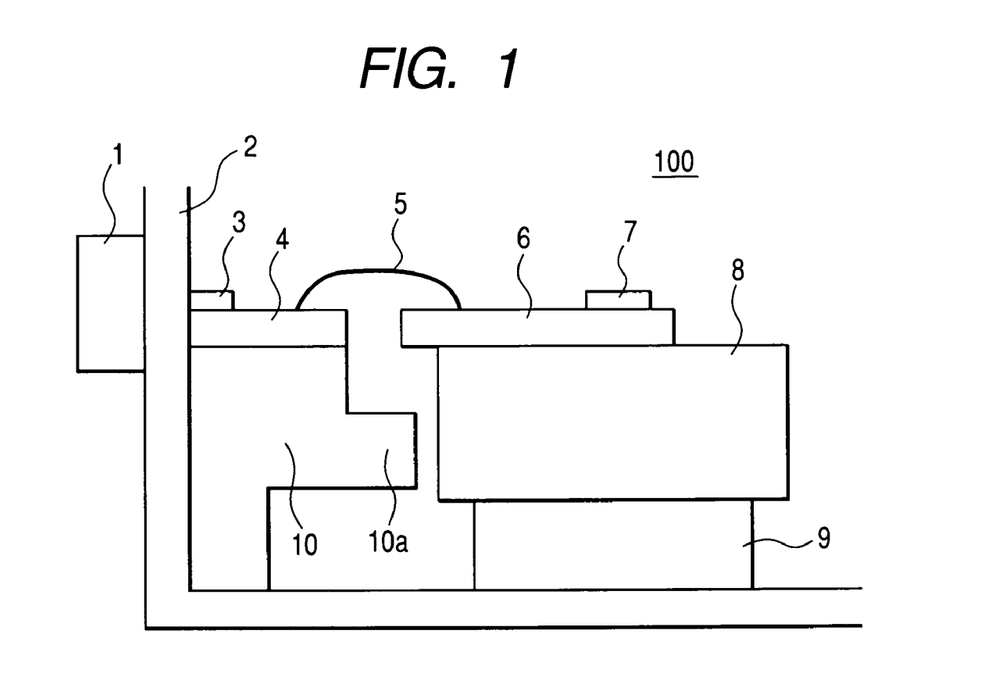
FIG. 1 is a side view of a laser module, explaining a first example of the present invention.
Figure 2:
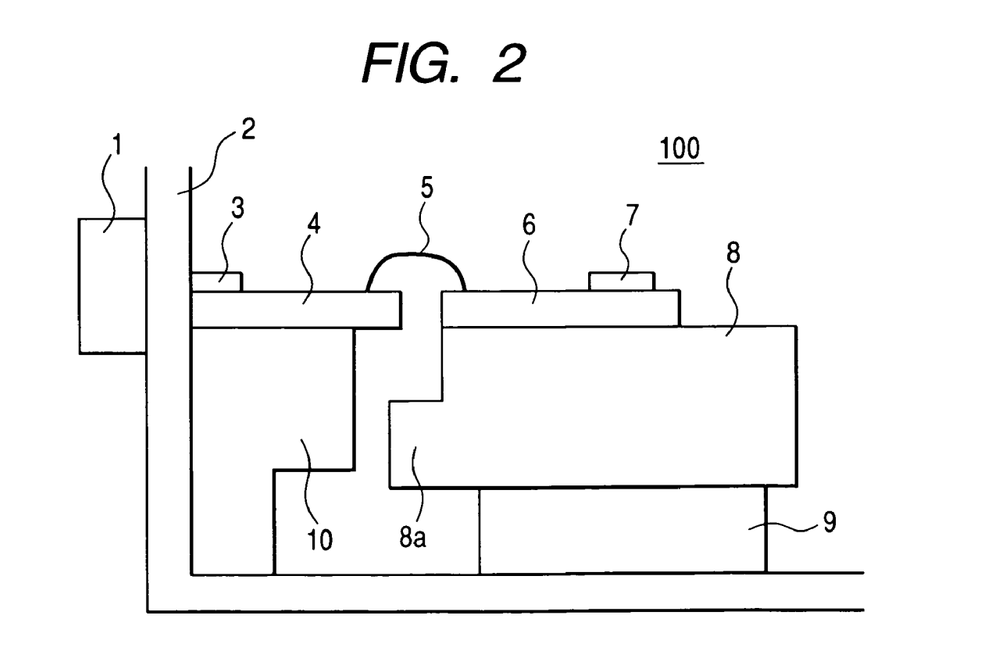
FIG. 2 is a side view of another laser module, explaining a modification based on the first example of the present invention.
Figure 3:
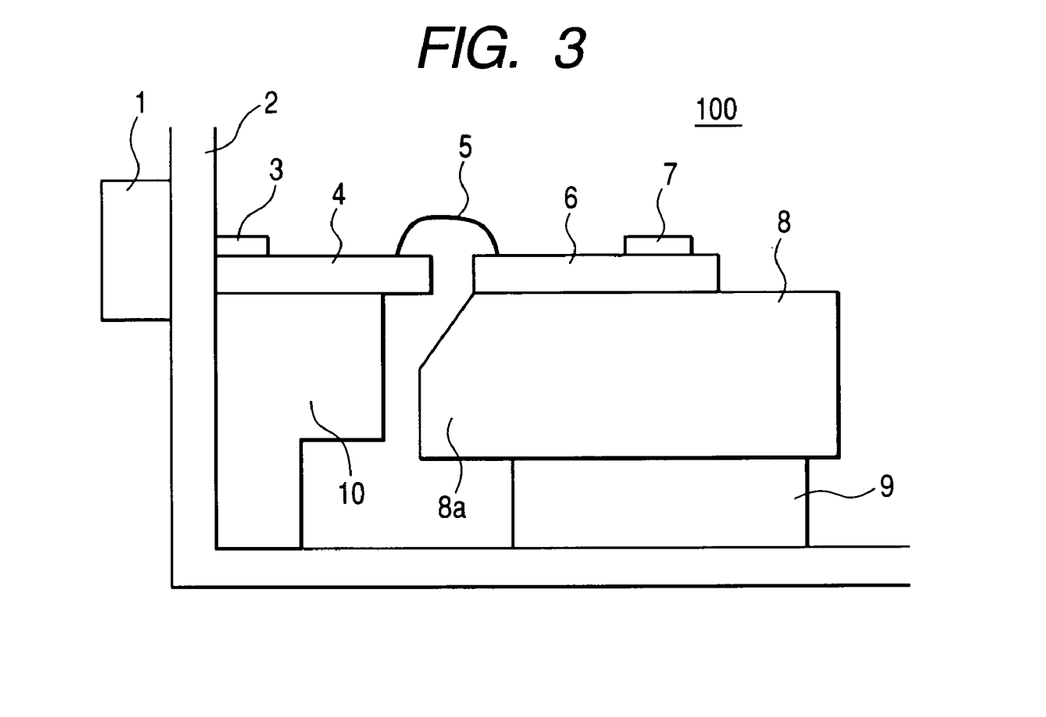
FIG. 3 is a side view of yet another laser module, explaining another modification based on the first example of the present invention.
Figure 4:
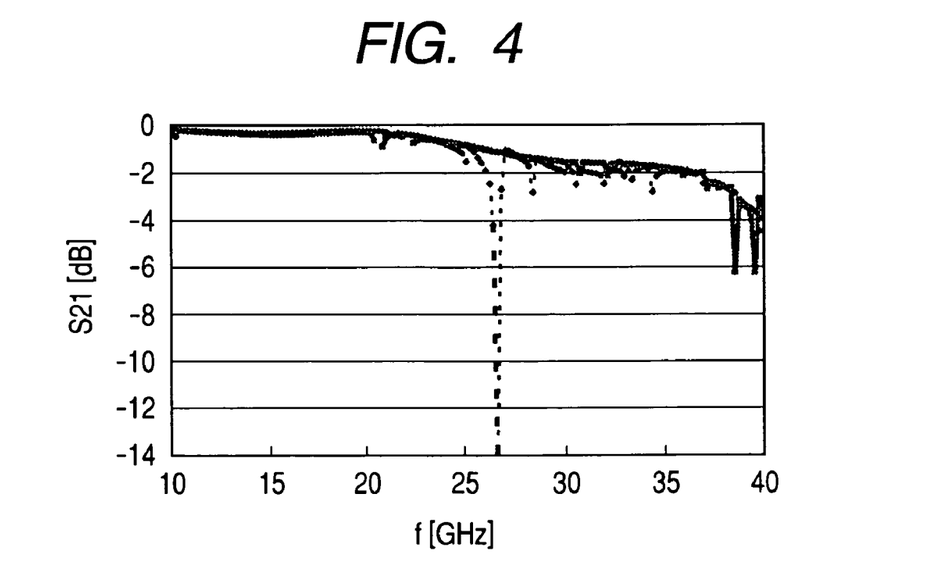
FIG. 4 is a transmission characteristics diagram explaining simulation results on the first example of the present invention.
Figure 5A:
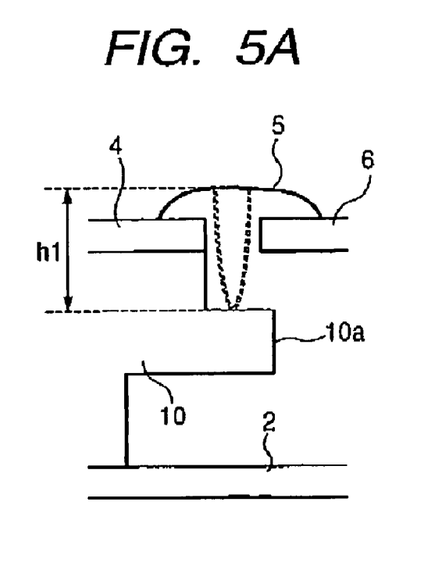
FIGS. 5A and 5B are diagrams that explain simulation of the first example of the present invention.
Figure 5B:
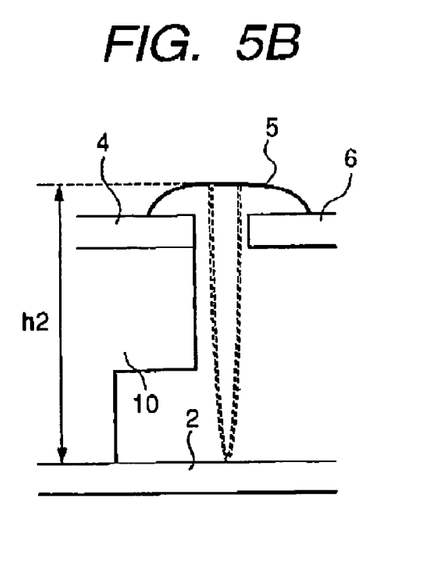

A first example of a laser module which is a first embodiment of the present invention is described below using FIGS. 1 to 5A, 5B. FIG. 1 is a side view explaining the laser module that is the first example of the present invention, FIGS. 2 and 3 are side views of other laser modules, explaining modifications based on the first example of the present invention, and FIGS. 4 and 5A, 5B are diagrams that explain transmission characteristics of the first example. In each of the above side views, front and rear walls of a package housing 2 are omitted. The same also applies to other examples.

As shown in FIG. 1, a laser module 100 according to the present example has a high-frequency connector section 1 on an outer wall of the package housing 2. After entering the package housing 2 through the high-frequency connector section 1, a high-frequency signal is transmitted to a grounded coplanar waveguide line provided on a high-frequency connector coaxial-pin packaging substrate 4 connected from a high-frequency connector coaxial-pin section 3 via solder (not shown). A semiconductor laser device 7 is mounted above a cooling element 9 via a semiconductor laser device packaging substrate 6 and a semiconductor laser device packaging substrate mounting conductor 8. On the semiconductor laser device packaging substrate 6 is also provided a grounded coplanar waveguide line, which is connected to the reverse side of the semiconductor laser device 7 and is further connected to the surface of the semiconductor laser device packaging substrate 6 via a bonding wire (not shown).

The laser module 100 in the present example is for 40 Gbits/s use, and this module converts 40 Gbits/s high-frequency signals (electrical signals) into optical signals and then sends the signals to a fiber transmission path not shown.

The high-frequency connector coaxial-pin packaging substrate 4 and the semiconductor laser device packaging substrate 6 are connected via a ribbon 5 after a required air gap for thermal separation has been provided between both substrates. A metallic cap (not shown) for hermetically sealing the semiconductor laser device 7 is, provided inside the package housing 2, and the package housing 2 is welded over its entire surface after being internally nitrogen-substituted using the cap. The entire package including the metallic cap is called the housing.

In the laser module 100, the semiconductor laser device 7 is mounted on the semiconductor laser device packaging substrate 6 mounted using AuSn solder (not shown), and above the semiconductor laser device packaging substrate mounting conductor 8 via SnAg solder (not shown). Similarly, the high-frequency connector coaxial-pin packaging substrate 4 is also mounted on a high-frequency connector coaxial-pin packaging substrate mounting conductor 10 via AuSn solder (not shown).

In order to obtain the same potential as that of the package housing 2, a metallic conductor is used as the high-frequency connector coaxial-pin packaging substrate mounting conductor 10. Inside an area ranging from the gap (ribbon 5) between the high-frequency connector coaxial-pin packaging substrate 4 and the semiconductor laser device packaging substrate 6, down to a lower inner face of the package housing 2, part of the high-frequency connector coaxial-pin packaging substrate mounting conductor 10 is formed into an eave-shaped structure 10a larger than at least a width of the gap. The eave-shaped structure 10a is constructed so that in a route ranging from the gap to the lower inner wall of the package that is shown at the bottom of FIG. 1, part of the route covered with an internal atmosphere of a hermetic container is shielded with the conductor 10 on which the high-frequency connector coaxial pin substrate 4 is mounted.

Advantageous effects of the foregoing construction are described below using FIGS. 4 and 5A, 5B. FIG. 4 is a diagram that shows dependence of S21 characteristics on frequency. FIGS. 5A, 5B are diagrams each explaining a ¼ wavelength of the specific standing wave occurring between the ribbon 5 and the conductor.

Structures of laser modules whose S21 characteristics were simulated are described hereunder using FIGS. 5A, 5B. FIG. 5A shows the eave-shaped structure 10a in the example described above. FIG. 5B shows a structure not having an eave-shaped portion. In the structure of FIG. 5B, since a perpendicular distance of "h2" from the ribbon 5 down to the lower inner wall of the package 2 is long, a standing wave occurs that is commensurate with a particular dimension of "h2". If the module has its entire signal route placed in an inert gas atmosphere and "h2" is 3 mm, a standing wave with a λ/4 wavelength becomes a 25 GHz signal wave and acts as a component that impedes 40 GHz transmission. In the structure of FIG. 5A, the high-frequency connector coaxial-pin packaging substrate mounting conductor 10 has an eave-shaped convex portion to form a conductor (shield section) on which the standing wave stands upright in the air gap. Perpendicular distance h1 from the ribbon 5 down to the conductor (shield section) having the same potential as that of the package 2 can thus be reduced. For "h1"=1.3 mm, the standing wave with a λ/4 wavelength becomes a 57.7 GHz signal wave and thus, resonance frequencies can be expelled in a direction of a region higher than a 40 GHz service band of the laser module in terms of frequency, whereby favorable transmission characteristics can be obtained. Since a λ/4 wavelength of 40 GHz signal waves is 1.88 mm, the h1 dimension of the laser module for 40 GHz use needs to be less than at least 1.88 mm. An "h1" dimension of 1.3 mm is further preferable.

Simulation results on the transmission characteristics of the two kinds of structures shown in FIGS. 5A, 5B are plotted in FIG. 4. In the structure of FIG. 5B, a significant dip in the transmission characteristics, coupled with resonance, is observed at a frequency of about 27 GHz. Conversely, in the structure of FIG. 5A, it can be seen that favorable characteristics can be obtained on a wide frequency band up to 40 GHz. These simulation results indicate that position control of the conductor forms an electric-field containment section and improves transmission deterioration due to resonance within transmission bands.

According to the present example, therefore, it is possible to obtain a 40 Gbits/s laser module improved in terms of transmission deterioration due to resonance within transmission bands.

As a modification based on the present example, a semiconductor laser device packaging substrate mounting conductor 8 may, as shown in FIG. 2, have an eave-shaped convex portion 8a at one side so that part of the route covered with an internal atmosphere of a hermetic container is shielded with the conductor on which a semiconductor laser device packaging substrate is mounted. In addition, as shown in FIG. 3, a wall surface of the conductor for mounting the semiconductor laser device packaging substrate does not need to be a plane parallel to a transmission path and may be formed as an oblique surface when viewed in a sectional form.

Furthermore, while a grounded coplanar waveguide line is used as a high-frequency line in the first example described above, a microstrip line or a coplanar waveguide line may be used instead. A high-frequency connector coaxial-pin packaging substrate 4 and a semiconductor laser device packaging substrate 6 may be connected by wire bonding. A ribbon for ribbon bonding, and a wire for wire bonding are simply called connection wires. The appropriate metal/method used for metal bonding such as soldering or brazing can be determined according to particular process requirements.

Besides, while laser device driving ribbon connection between the high-frequency connector coaxial-pin packaging substrate 4 and the semiconductor laser device packaging substrate 6 has been described in the above first example, since monitor photodiode (PD) and thermistor are usually mounted on the semiconductor laser device packaging substrate 6, advantageous effects similar to those of the present invention can also be obtained for those circuit components.

Although the standing waves occurring between the ribbon and the, package housing have also been described in the above first example, the same also occurs between the ribbon and the metallic cap. In addition, the same applies to the above-described examples of modification and to the other examples set forth hereunder.

SECOND EXAMPLE

Figure 6:
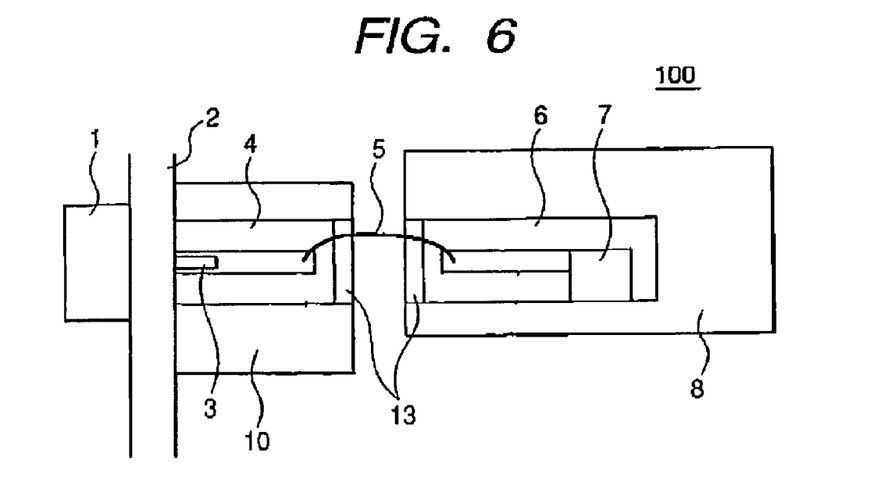
FIG. 6 is a plan view of a further laser module, explaining a second example of the present invention.
Figure 7:
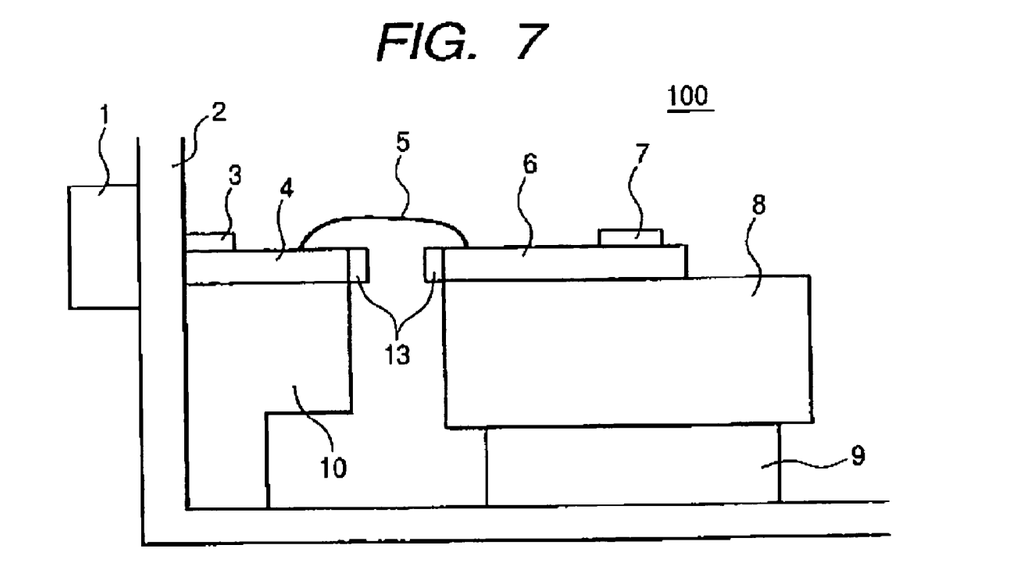
FIG. 7 is a side view of a further laser module, explaining a modification based on the second example of the present invention.
Figure 8:
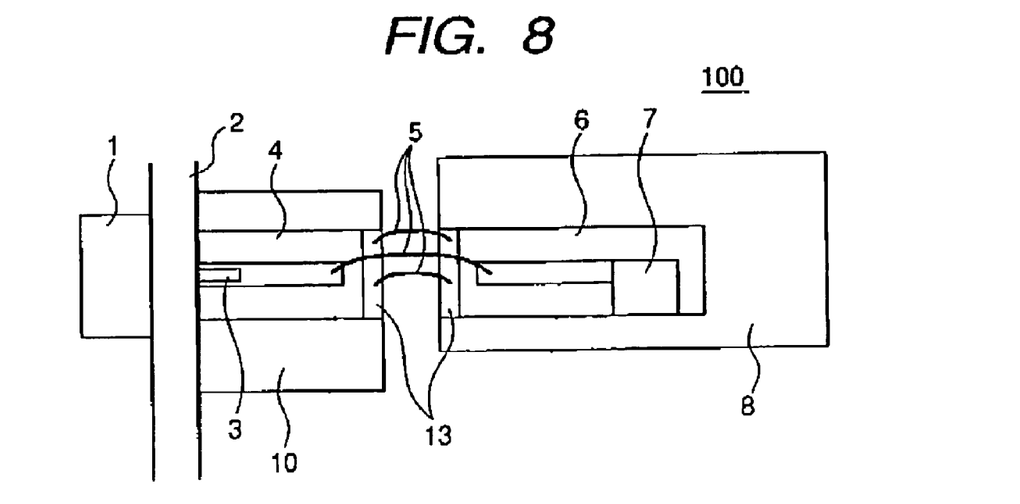
FIG. 8 is a plan view of a further laser module, explaining yet another modification based on the second example of the present invention.

A second example of the laser module that is the first embodiment of the present invention is described below using FIGS. 6 to 8. FIG. 6 is a plan view explaining the laser module that is the second example of the present invention, FIG. 7 is a side view of the laser module, explaining a modification based on the second example of the present invention, and FIG. 8 is a plan view of the laser module, explaining another modification based on the second example of the present invention.

A laser module 100 in the present example is shown in FIG. 6. The reference numbers used in the figure are the same as used in the first example. Only different sections are therefore described below. A high-frequency connector coaxial-pin packaging substrate mounting conductor 10 for mounting a high-frequency connector coaxial-pin packaging substrate 4 has an outline not provided with the eave-shaped convex portion shown in FIG. 5B. Also, the high-frequency connector coaxial-pin packaging substrate 4 and a semiconductor laser device packaging substrate 6 both have a conductor 13 formed on upper faces of respective sides opposed to each other, and the conductors 13 are connected to respective conductors on which the substrates are mounted, via silver paste not shown. Constructing the laser module in this way yields an advantageous effect in that the electric field irradiated from a ribbon-bonded section 5 of a low electric-field containment level into a package housing 2 can be suppressed by proximate arrangement of the conductors 13 provided with the same potential as that of the package housing 2.

According to the present example, therefore, it is possible to obtain a 40 Gbits/s laser module improved in terms of transmission deterioration due to resonance within transmission bands.

According to the present example, it is also possible to form the conductors 13 simultaneously with formation of a high-frequency line, and to manufacture the module without making shapes of the mounting conductors complex.

As a modification based on the present example, a high-frequency connector coaxial-pin packaging substrate 4 and a semiconductor laser device packaging substrate 6 are both formed with a conductor 13 on lateral faces of respective sides opposed to each other, as in the laser module 100 shown in FIG. 7. Both conductors 13 are made of silver paste, for example. The conductors 13 are connected to respective conductors on which the above substrates are mounted. Constructing the laser module in this way yields an advantageous effect in that the electric field irradiated from a ribbon-bonded section 5 of a low electric-field containment level into a package housing 2 can be suppressed by proximate arrangement of the conductors 13 provided with the same potential as that of the substrate-mounting conductors.

According to the present example, therefore, it is possible to obtain a 40 Gbits/s laser module improved in terms of transmission deterioration due to resonance within transmission bands.

As another modification based on the present example, in the laser module 100 shown in FIG. 8, in addition to the signal transmission ribbon used in the second example, two more ribbons 5 are used to connect two conductors 13 to each other in such a manner that the signal transmission ribbon is sandwiched between the added ribbons 5. Constructing the laser module in this way makes a further electric-field containment effect obtainable in the present modification based on the present example.

THIRD EXAMPLE

Figure 9:
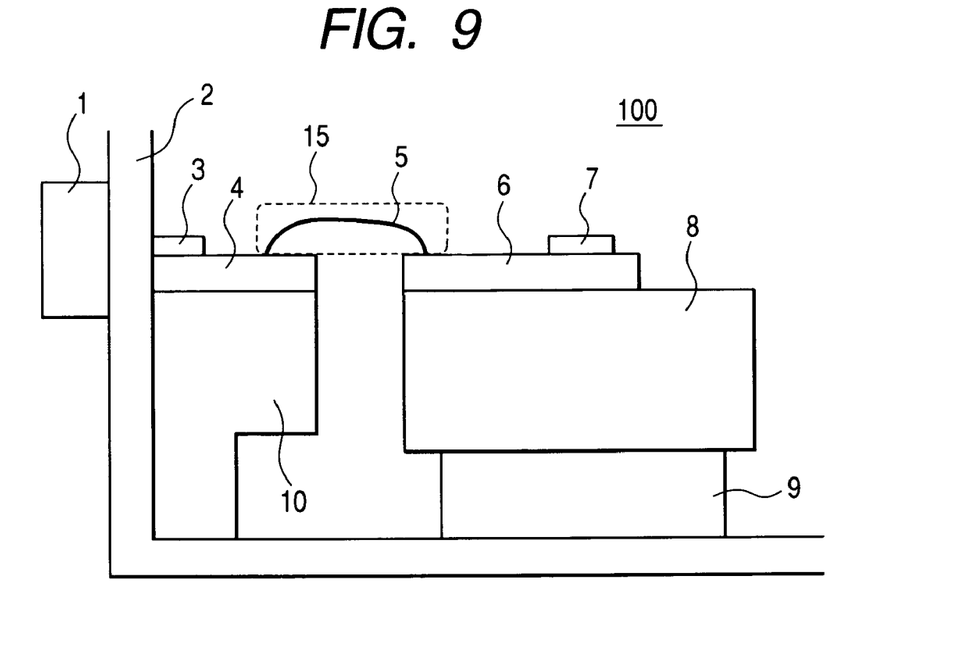
FIG. 9 is a side view of a further laser module, explaining a third example of the present invention.

A third example of the laser module that is the first embodiment of the present invention is described below using FIG. 9. FIG. 9 is a side view explaining the laser module that is the third example of the present invention.

A laser module 100 in the present example is shown in FIG. 9. The reference numbers used in the figure are the same as used in the first example. Only different sections are therefore described below. A high-frequency connector coaxial-pin packaging substrate mounting conductor 10 for mounting a high-frequency connector coaxial-pin packaging substrate 4 has an outline not provided with the eave-shaped convex portion shown in FIG. 5B. Wire bonding is used as a method of connecting the high-frequency connector coaxial-pin packaging substrate 4 and a semiconductor laser device packaging substrate 6. Additionally, the periphery of a bonding wire with a diameter of 25 μm (micrometers) is potted for a diameter of 100-300 μm using thermosetting silicone resin of a 4 to 7 dielectric constant, then thermoset, and resin-coated. Thus, wire-bonded sections can be brought close to a 50 ohm line.

According to the present embodiment, an electric-field containment effect equivalent to that achievable for a high-frequency line can also be obtained at wire-bonded sections.

According to the present example, therefore, it is possible to obtain a 40 Gbits/s laser module improved in terms of transmission deterioration due to resonance within transmission bands.

While thermosetting resin is used in the present example, photosetting resin may be used instead. Although a silicone-based resin material is used, general epoxy-based resin or acrylate-based resin may be used instead.

In addition, depending on a particular combination of a wire-bonding diameter and a potting diameter, an arbitrary line impedance can be created.

The methods of electric field containment, shown in the first to third examples, are independent of one another, and these methods can also be combined to embody the present invention.

FOURTH EXAMPLE

Figure 10:
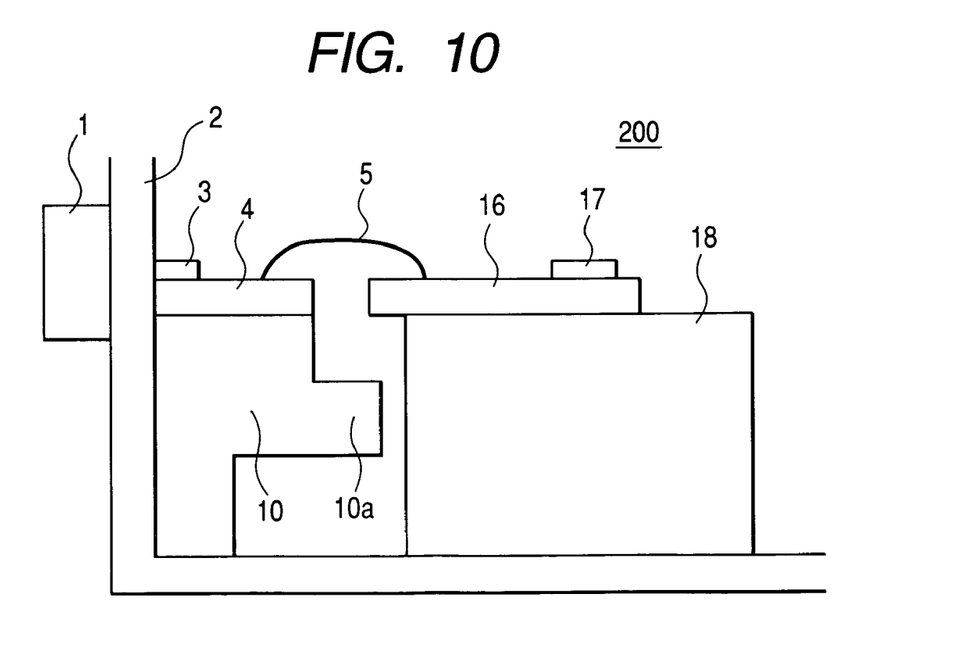
FIG. 10 is a side view of a photodiode module, explaining a fourth example of the present invention.

An example of a photodiode module which is a second embodiment of the present invention is described below using FIG. 10. FIG. 10 is a side view explaining the photodiode module that is a fourth example of the present invention.

A photodiode module 200 in the present example is shown in FIG. 10. As can be seen from the figure, this module has a structure very similar to those of the laser modules shown in the first to third examples. A 40 Gbits/s optical signal that has been transmitted from an optical fiber transmission path not shown is received by a photodiode element 17 and then converted into a high-frequency electrical signal. The photodiode element 17 is mounted on a photodiode element packaging substrate 16 on which a grounded coplanar waveguide line is formed, and the photodiode element is connected to the grounded coplanar waveguide line, at the reverse side of the element, and a bonding wire not shown. The high-frequency electrical signal is transmitted from the grounded coplanar waveguide line on the photodiode element packaging substrate 16 to a grounded coplanar waveguide line provided on a high-frequency connector coaxial-pin packaging substrate 4. The grounded coplanar waveguide line provided on the high-frequency connector coaxial-pin packaging substrate 4 is connected to a high-frequency connector coaxial-pin section 3 via solder (not shown). The high-frequency electrical signal can therefore be acquired from a high-frequency connector section 1 installed on an outer wall of a package housing 2.

The photodiode element 17 is packaged in the package housing 2 via the photodiode element packaging substrate 16 and a photodiode element packaging substrate mounting conductor 18. The high-frequency connector coaxial-pin packaging substrate 4 and the photodiode element packaging substrate 16 are independently mounted on a high-frequency connector coaxial-pin packaging substrate mounting conductor 10 and the photodiode element packaging substrate mounting conductor 18, respectively, and are therefore connected using a ribbon 5. A metallic cap (not shown) for hermetically sealing the photodiode element 17 is provided inside the package housing 2, and the package housing 2 is welded over its entire surface after being internally nitrogen-substituted using the cap.

In order to obtain the same potential as that of the package housing 2, a metallic conductor is used as the high-frequency connector coaxial-pin packaging substrate mounting conductor 10. Inside an area ranging from a gap (ribbon 5) between the high-frequency connector coaxial-pin packaging substrate 4 and the photodiode element packaging substrate, down to a lower inner face of the package housing 2, part of the high-frequency connector coaxial-pin packaging substrate mounting conductor 10 is formed into an eave-shaped structure larger than at least a width of the gap. This eave-shaped structure is constructed so that in a route ranging from the gap to the lower inner wall of the package that is shown at the bottom of FIG. 10, part of the route covered with an internal atmosphere of a hermetic container is shielded with the conductor 10 on which a line substrate is mounted.

The photodiode module in the present example, and the laser module in the first example differ in that whereas the former is for receiving optical signals, the latter is for transmitting optical signals. In the present example, therefore, high-frequency electrical signals are transmitted from the photodiode element 17 to the ribbon 5, and the high-frequency connector section 1, in that order, whereas, in the first example, these signals are transmitted to the high-frequency connector section 1, the ribbon 5, and the semiconductor laser device 7. Both modules, however, are the same in that 40 Gbits/s electrical signals pass through the section of the ribbon 5 that is not a high-frequency line, and in the foregoing eave-shaped structure, therefore, resonance frequencies can be expelled in a direction of a region higher than a 40 GHz band in terms of frequency. According to the present example, therefore, it is possible to obtain a 40 Gbits/s photodiode module improved in terms of transmission deterioration due to resonance within transmission bands.

In addition, it goes without saying that all combinations between the modifications based on the first example of the laser module, the second and third examples, modifications thereof, and modifications based on the above-described fourth example, are applicable to the photodiode module.

FIFTH EXAMPLE

Figure 11:
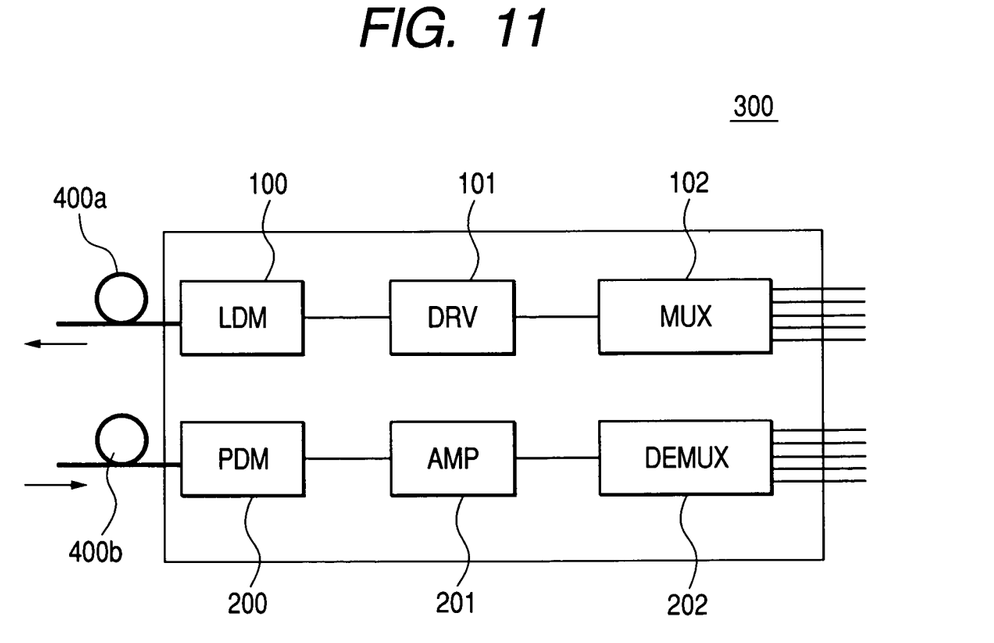
FIG. 11 is a block diagram of an optical transmission apparatus, explaining a fifth example of the present invention.

An example of an optical transmission apparatus which is a third embodiment of the present invention is described below using FIG. 11. FIG. 11 is a block diagram explaining the optical transmission apparatus forming a fifth example of the present invention.

In the optical transmission apparatus 300 shown in FIG. 11, a signal multiplexer 102 converts 2.5 Gbits/s×16-wave signals into a 40 Gbits/s electrical signal by multiplexing, and transmits the signal to a laser module 100 via a driver 101. The laser module 100 converts a 40 Gbits/s electrical signal into a 40 Gbits/s optical signal and sends the signal to an up-transmission path fiber 400a. A 40 Gbits/s optical signal from a down-transmission path fiber 400b is received by a photodiode module 200, in which the signal is then converted into a 40 Gbits/s electrical signal. Since the 40 Gbits/s optical signal is attenuated on the transmission path, the electrical signal is also a very weak signal. The 40 Gbit's/s electrical signal, after being amplified by an amplifier 201, is separated into sixteen 2.5 Gbits/s electrical signals by a signal demultiplexer 202.

In the optical transmission apparatus according to the present example, optical transmission excellent in transmission characteristics is possible since any of the laser modules 100 described in the first to third examples is used. Additionally, in the optical transmission apparatus according to the present example, optical transmission excellent in transmission characteristics is possible since the photodiode module 200 described in the fourth example is used.

The optical transmission apparatus according to the present example may be called the optical transmitter/receiver. Also, the signal multiplexer 102, driver 101, and laser module 100 in FIG. 11 are collectively called "optical transmitter". In addition, the photodiode module 200, amplifier 201, and signal demultiplexer 202 in the figure are collectively called "optical receiver".

In the description of this Specification, the optical transmitter and the optical receiver are each called "optical transmission apparatus". The laser module 100 and the photodiode module 200 are each called "optical module". The optical module, however, includes not only these elements, but also a modulator module, for example. The laser device 7 and the photodiode element 17 are each called "optical element". The optical element, however, includes not only these elements, but also a modulator element, for example.

According to the present invention, it is possible to prevent resonance from occurring on the route between bonded connections and the package housing. A high-performance optical module and optical transmission apparatus can thus be provided.

We claim:
1. An optical module comprising:
  a first high-frequency line substrate with an optical element mounted thereon;

a first substrate mounting conductor which mounts the first high-frequency line substrate;

a second high-frequency line connected to said first high-frequency line substrate via a connection wire;

a second substrate mounting conductor which mounts the second high-frequency line substrate;

a housing for accommodating said first high-frequency line substrate and said second high-frequency line substrate; and a cooling element which mounts the first substrate mounting conductor for cooling a temperature of the optical element;

wherein said second substrate mounting conductor is made of an electrical conductor, wherein said first high-frequency line substrate and said second substrate mounting conductor are spatially separated, wherein said second high-frequency line substrate and said first substrate mounting conductor are spatially separated, wherein said first substrate mounting conductor and said second substrate mounting conductor are thermally within the housing by mounting said first substrate mounting conductor on the cooling element in the housing and by mounting said second substrate mounting conductor on the housing, wherein an electric-field containment section is provided near said connection wire, and wherein a standing wave occurring between said connection wire and said housing is expelled as an out-of-service band wave.

2. The optical module according to claim 1, wherein said connection wire is coated with resin.

3. An optical module comprising:

a first high-frequency line substrate with an optical element mounted thereon;

a first substrate mounting conductor which mounts the first high-frequency line substrate;

a second high-frequency line substrate which is connected to said first high-frequency line substrate via a connection wire;

a second substrate mounting conductor which mounts the second high-frequency line substrate; and a housing for accommodating said first high-frequency line substrate and said second high-frequency line substrate; and a cooling element which mounts the first substrate mounting conductor for cooling a temperature of the optical element;

wherein said second substrate mounting conductor is made of an electrical conductor, wherein said first high-frequency line substrate and said second substrate mounting conductor are spatially separated, wherein said second high-frequency line substrate and said first substrate mounting conductor are spatially separated, wherein said first electrical mounting conductor and said second substrate mounting conductor are thermally separated and within the housing by mounting said first substrate mounting conductor on the cooling element in the housing, and by mounting said second substrate mounting conductor on the housing, wherein a shield section for establishing electrical connection to said housing is disposed between said connection wire and said housing, and wherein a standing wave occurring between said connection wire and said housing is expelled as an out-of-service band wave.

4. The optical module according to claim 3, wherein a distance between said connection wire and said shield section is less than 1.88 mm.

5. The optical module according to claim 4, wherein a distance between said connection wire and said shield section is less than or equal to 1.3 mm.

* * * * *